(12) United States Patent
Pullela et al.

(10) Patent No.: US 8,275,326 B2
(45) Date of Patent: Sep. 25, 2012

(54) SYSTEM AND METHOD FOR LOW NOISE OUTPUT DIVIDER AND BUFFER HAVING LOW CURRENT CONSUMPTION

(75) Inventors: Rajasekhar Pullela, Colton, CA (US); Sohrab Samadian, Newport Beach, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 1000 days.

(21) Appl. No.: 11/837,003

(22) Filed: Aug. 10, 2007

(65) Prior Publication Data

US 2009/0042517 A1    Feb. 12, 2009

(51) Int. Cl.
*H04B 1/40* (2006.01)

(52) U.S. Cl. ............. 455/77; 455/73; 327/115; 327/117

(58) Field of Classification Search ............ 455/77, 455/73, 76; 331/16; 327/115, 117; 333/218
See application file for complete search history.

(56) References Cited

U.S. PATENT DOCUMENTS

| | | | |
|---|---|---|---|
| 2005/0219000 A1* | 10/2005 | Wu | 331/16 |
| 2006/0208776 A1* | 9/2006 | Tonietto et al. | 327/117 |
| 2006/0279363 A1* | 12/2006 | Shirasu | 331/16 |

* cited by examiner

*Primary Examiner* — Nay A Maung
*Assistant Examiner* — Angelica M Perez
(74) *Attorney, Agent, or Firm* — Knobbe Martens Olson & Bear, LLP

(57) ABSTRACT

A low noise divider includes a voltage controlled oscillator (VCO) having a first frequency output, a frequency divider configured to receive the first frequency output and configured to provide a second frequency output; and a buffer circuit configured to receive the first frequency output and the second frequency output, the buffer circuit configured to provide the second frequency output as an output of the low noise divider, where a phase noise of the second frequency output is dependent only on a phase noise of the first frequency output.

18 Claims, 12 Drawing Sheets

US 8,275,326 B2

SYSTEM AND METHOD FOR LOW NOISE OUTPUT DIVIDER AND BUFFER HAVING LOW CURRENT CONSUMPTION

BACKGROUND

Radio frequency (RF) transceivers are found in many one-way and two-way communication devices, such as portable communication devices, (cellular telephones), personal digital assistants (PDAs) and other communication devices. A modern RF transceiver must be capable of operating using a number of different frequency plans and communication methodologies, which are dictated by the particular communication system within which the transceiver is operating.

However, supporting multiple communication bands on a single RF chip increases the complexity of such systems. As the complexity grows, a major concern is minimizing the power consumption of the radio. Therefore, recent implementations focus mainly on reduction in complexity, cost and power. As an example, in a complementary metal oxide semiconductor (CMOS) based transceiver for quad band cellular applications, the phase noise requirement for the Global System for Mobile Communications (GSM) is −162 dBc/Hz at 20 MHz away from the carrier for the transmitted signal. This requirement translates to increased power consumption in the local oscillator (LO) generation chain.

The center frequency of the transmitted mask in the GSM850 communication band varies from 824-849 MHz and it varies from 890-915 MHz in the GSM900 communication band. However, the voltage controlled oscillator (VCO), which generates the transmit center frequency, is designed to oscillate at a multiple of the transmitted frequency (usually 2 or 4 times, depending on the transmit band) in order to reduce the effect of LO direct feed-through. Then a series of dividers converts the generated frequency to the desired frequency. One example of a frequency plan uses two consecutive divide-by-two elements after a VCO operating at approximately 3-4 GHz to obtain the desired transmit frequency.

It is desirable to minimize the phase noise contributed by the dividers and buffers used in the frequency divider to the final phase noise of the generated low band and high band frequency tones. For applications such as a CMOS based GSM transceiver, where the transmitted signal phase noise requirement is stringent, this requirement mandates high current consumption in the sequential dividers that are used to develop the transmit frequency. This in turn will undesirably raise the overall power consumption of the radio transceiver.

Therefore, it is desirable to minimize the amount of phase noise contributed by a frequency divider.

SUMMARY

Embodiments of the invention include a low noise divider, comprising a voltage controlled oscillator (VCO) having a first frequency output, a frequency divider configured to receive the first frequency output and configured to provide a second frequency output, and a buffer circuit configured to receive the first frequency output and the second frequency output, the buffer circuit configured to provide the second frequency output as an output of the low noise divider, where a phase noise of the second frequency output is dependent only on a phase noise of the first frequency output.

Other methods, systems and embodiments are also provided. Other systems, methods, features, and advantages of the invention will be or become apparent to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE FIGURES

The invention can be better understood with reference to the following figures. The components within the figures are not necessarily to scale, emphasis instead being placed upon clearly illustrating the principles of the invention. Moreover, in the figures, like reference numerals designate corresponding parts throughout the different views.

DETAILED DESCRIPTION

Figure 1:
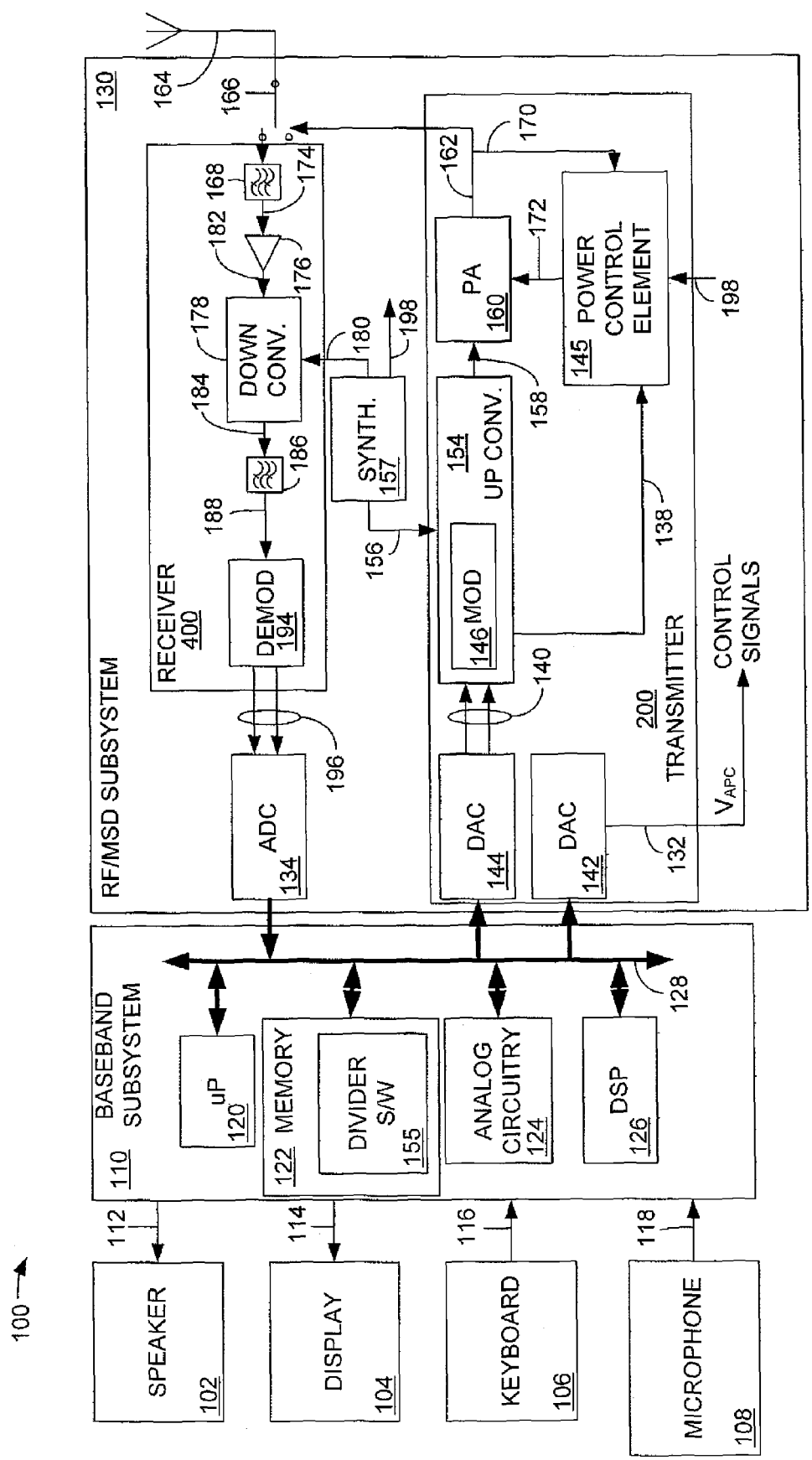
FIG. 1 is a block diagram illustrating a simplified portable transceiver.

Although described with particular reference to generating a transmit frequency for a portable transceiver, the system and method for low noise output divider and buffer having low current consumption (referred to below as the "low noise divider") can be implemented in any transmit or receive system where it is desirable to divide a frequency to a lower frequency.

The low noise divider can be implemented in hardware, software, or a combination of hardware and software. When implemented in hardware, the low noise divider can be implemented using specialized hardware elements and logic. When the low noise divider is implemented partially in software, the software portion can be used to precisely control the various components in the low noise divider. The software can be stored in a memory and executed by a suitable instruction execution system (microprocessor). The hardware implementation of the low noise divider can include any or a combination of the following technologies, which are all well known in the art: discrete electronic components, a discrete logic circuit(s) having logic gates for implementing logic functions upon data signals, an application specific integrated circuit having appropriate logic gates, a programmable gate array(s) (PGA), a field programmable gate array (FPGA), etc.

The software for the low noise divider comprises an ordered listing of executable instructions for implementing logical functions, and can be embodied in any computer-readable medium for use by or in connection with an instruction execution system, apparatus, or device, such as a computer-based system, processor-containing system, or other system that can fetch the instructions from the instruction execution system, apparatus, or device and execute the instructions.

In the context of this document, a "computer-readable medium" can be any means that can contain, store, communicate, propagate, or transport the program for use by or in connection with the instruction execution system, apparatus, or device. The computer-readable medium can be, for example but not limited to, an electronic, magnetic, optical, electromagnetic, infrared, or semiconductor system, apparatus, device, or propagation medium. More specific examples (a non-exhaustive list) of the computer-readable medium would include the following an electrical connection (electronic) having one or more wires, a portable computer diskette (magnetic), a random access memory (RAM), a read-only memory (ROM), an erasable programmable read-only memory (EPROM or Flash memory) (magnetic), an optical fiber (optical), and a portable compact disc read-only memory (CDROM) (optical). Note that the computer-readable medium could even be paper or another suitable medium upon which the program is printed, as the program can be electronically captured, via for instance, optical scanning of the paper or other medium, then compiled, interpreted or otherwise processed in a suitable manner if necessary, and then stored in a computer memory.

FIG. 1 is a block diagram illustrating a simplified portable transceiver 100 in which the low noise divider may be implemented. The portable transceiver 100 includes speaker 102, display 104, keyboard 106, and microphone 108, all connected to baseband subsystem 110. In a particular embodiment, the portable transceiver 100 can be, for example but not limited to, a portable telecommunication handset such as a mobile cellular-type telephone. The speaker 102 and the display 104 receive signals from the baseband subsystem 110 via connections 112 and 114, respectively, as known to those skilled in the art. Similarly, the keyboard 106 and the microphone 108 supply signals to the baseband subsystem 110 via connections 116 and 118, respectively. The baseband subsystem 110 includes microprocessor (μP) 120, memory 122, analog circuitry 124, and digital signal processor (DSP) 126 in communication via bus 128. The bus 128, though shown as a single connection, may be implemented using a number of busses connected as necessary among the subsystems within baseband subsystem 110. The microprocessor 120 and the memory 122 provide the signal timing, processing and storage functions for the portable transceiver 100. If portions of the low noise divider are implemented in software, then the memory 122 also includes divider software 155 that can be executed by the microprocessor 120, the DSP 126 or by another processor.

The analog circuitry 124 provides the analog processing functions for the signals within the baseband subsystem 110. The baseband subsystem 10 communicates with the radio frequency (RF)/mixed signal device (MSD) subsystem 130 via the bus 128.

The RF/MSD subsystem 130 includes both analog and digital components. Generally, the RF/MSD subsystem 130 includes a transmitter 200, a synthesizer 157 and a receiver 400. In this example, the RF/MSD subsystem 130 includes an analog-to-digital converter 134, and the transmitter 200 includes one or more digital-to-analog converters (DACS) 142 and 144. However, other architectures and implementations of a transceiver are possible.

In an embodiment, the baseband subsystem 110 provides an automatic power control signal (supplied as an analog voltage signal and referred to as $V_{APC}$) to the RF/MSD subsystem 130. Although shown as a single connection 132, the control signals may originate from the DSP 126 from the microprocessor 120, or from another element, and are supplied to a variety of points within the RF/MSD subsystem 130 by the DAC 142. It should be noted that, for simplicity, only the basic components of portable transceiver 100 are illustrated.

The ADC 134, the DAC 142 and the DAC 144 also communicate with microprocessor 120, memory 122, analog circuitry 124 and DSP 126 via bus 128. The DAC 144 converts the digital communication information within baseband subsystem 110 into an analog signal for transmission by the transmitter 200 via connection 140. Connection 140, while shown as two directed arrows, includes the information that is to be transmitted by RF/MSD subsystem 130 after conversion from the digital domain to the analog domain.

The DAC 144 may operate on either baseband in-phase (I) and quadrature-phase (Q) components or phase and amplitude components of the information signal. In the case of I and Q signals, the modulator 146 is an I/Q modulator as known in the art while in the case of phase and amplitude components, the modulator 146 operates as a phase modulator utilizing only the phase component and passes the amplitude component, unchanged, to the power control element 145. The DAC 142 supplies various other control signals to various components within the RF/MSD subsystem 130 via connection 132.

The modulator 146 modulates either the I and Q information signals or the phase information signal received from the DAC 144 onto a frequency reference signal referred to as a "local oscillator" or "LO" signal provided by the synthesizer 157 via connection 156. In this example, the modulator 146 is part of the upconverter 154, but need not be.

The modulator 146 also supplies an intermediate frequency (IF) signal containing only the desired amplitude modulated (AM) signal component on connection 138 for input to the power control element 145 via connection 138. The AM signal supplied by the modulator 146 is an intermediate frequency (IF) AM signal with a constant (average) power level that is supplied as a reference signal. The operation of the power control element 145, which forms a closed power control loop, will be described below with reference to FIG. 2.

The synthesizer 157 determines the appropriate frequency to which the upconverter 154 will translate the modulated signal. In this embodiment, the synthesizer 157 uses a single voltage controlled oscillator (VCO), operating at a center frequency of approximately 3.0 to 4.0 (GHz) in this example, and uses embodiments of the low noise divider to provide the desired LO signals to the transmitter 200 and to the receiver 400.

The upconverter 154 supplies a phase modulated signal at the appropriate transmit frequency via connection 158 to the power amplifier 160. The power amplifier 160 amplifies the phase modulated signal on connection 158 to the appropriate power level for transmission via connection 162 to antenna 164 illustratively, switch 166 controls whether the amplified signal on connection 162 is transferred to antenna 164 or whether a received signal from antenna 164 is supplied to filter 168. The operation of switch 166 is controlled by a control signal from baseband subsystem 110 via connection 132.

In an embodiment, a portion of the amplified transmit signal power on connection 162 can be supplied via connection 170 to power control element 145. In this embodiment, the power control element 145 forms a continuous closed power control feedback loop and supplies an information signal on connection 172 instructing the power amplifier 160 as to the power to which the signal on connection 158 should be amplified. The power control element 145 also receives an LO signal from the synthesizer 157 via connection 198.

A signal received by antenna 164 may, at the appropriate time determined by baseband subsystem 110, be directed via switch 166 to a receive filter 168. Instead of the switch 166, other circuits, such as a duplexer, may be employed to split the transmit and receive signals. The receive filter 168 filters the received signal and supplies the filtered signal on connection 174 to a low noise amplifier (LNA) 176. Although a single LNA 176 is shown in FIG. 1, it is understood that a plurality of LNAs are typically used, depending on the frequency or frequencies on which the portable transceiver 100 operates. The receive filter 168 may be a bandpass filter that passes all channels of the particular cellular system where the portable transceiver 100 is operating. As an example, for a 900 MHz GSM system, receive filter 168 would pass all frequencies from 925.1 MHz to 959.9 MHz, covering all 175 contiguous channels of 200 kHz each. The purpose of the receive filter 168 is to reject all frequencies outside the desired region. The LNA 176 amplifies the very weak signal on connection 174 to a level at which downconverter 178 can translate the signal from the transmitted frequency back to a baseband frequency. Alternatively, the functionality of the LNA 176 and the downconverter 178 can be accomplished using other elements, such as, for example but not limited to, a low noise block downconverter (LNB). In this example, the receiver 400 operates as a direct conversion receiver (DCR) in which the received RF signal is downconverted directly to a baseband signal. In one embodiment, the LNA 176 is fully differential and operates using no voltage gain such that large electric fields are eliminated at the input to the LNA 176.

The downconverter 178 receives one or more LO signals from synthesizer 157 via connection 180. In this embodiment, the LO signals are shifted in phase by approximately 45 degrees to provide frequency translation of the in-phase and the quadrature-phase received signals without the use of polyphase filters or large inductances in the receive signal path. The synthesizer 157 determines the frequency to which to downconvert the signal received from the LNA 176 via connection 180. In the case of a DCR, the received signal is converted directly to baseband (DC), or near-baseband. The downconverter 178 sends the downconverted signal via connection 184 to a channel filter 186, also called the "IF filter." The channel filter 186 selects the one desired channel and rejects all others. Using the GSM system as an example, only one of the 175 contiguous channels is actually to be received. After all channels are passed by the receive filter 168 and downconverted in frequency by the downconverter 178, only the one desired channel will appear precisely at the center frequency of channel filter 186. The synthesizer 157, by controlling the local oscillator frequency supplied on connection 180 to downconverter 178, determines the selected channel. The demodulator 194 recovers the transmitted analog information and supplies a signal representing this information via connection 196 to the ADC 134. The ADC 134 converts these analog signals to a digital signal at baseband frequency and transfers it via bus 128 to DSP 126 for further processing.

Figure 2:
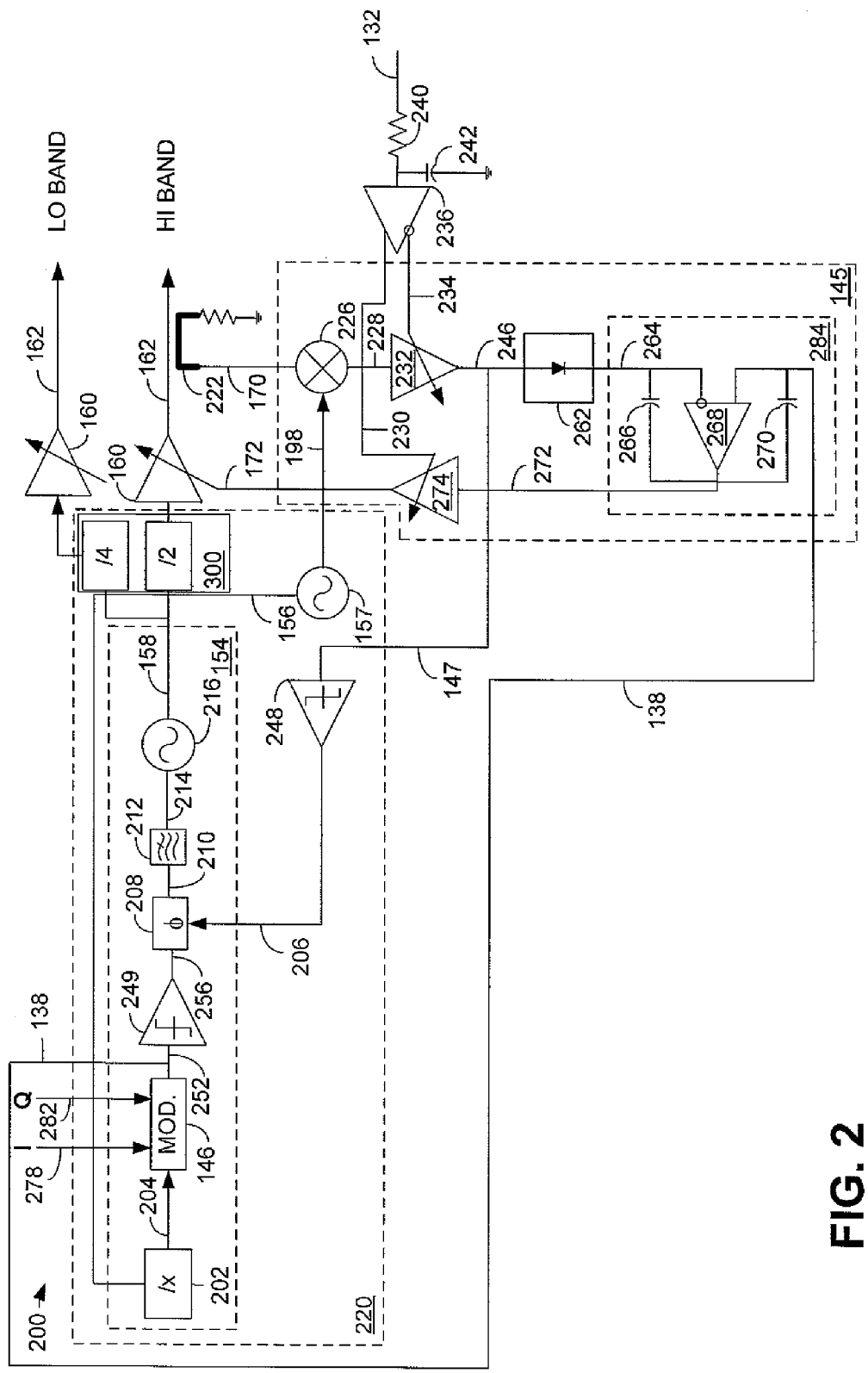
FIG. 2 is a block diagram illustrating the transmitter of FIG. 1.

FIG. 2 is a block diagram illustrating the transmitter 200 of FIG. 1. Beginning with a description of the power control loop 145, a portion of the output power present at the output of power amplifier 160 on connection 162 is diverted by a coupler 222 via connection 170 and input to a mixer 226 in the feedback path. The mixer 226 is also referred to as an "RF" mixer. The mixer 226 receives a local oscillator (LO) signal from the synthesizer 157 via connection 198 in FIG. 1.

The mixer 226 downconverts the RF signal on connection 170 to an intermediate frequency (IF) signal on connection 228. For example, the mixer 226 translates a signal having a frequency of approximately 2 gigahertz (GHz) on connection 170 to a frequency of approximately 100 megahertz (MHz) on connection 228 for input to the variable gain element 232. The variable gain element 232 can be, for example but not limited to, a variable gain amplifier or an attenuator. In such an arrangement, the variable gain element 232 might have a total variable gain range of approximately 70 decibels (dB). The variable gain element 232 receives a control signal input from the inverting output of amplifier 236 via connection 234. The input to amplifier 236 can be supplied via connection 132 from the DAC 142 of FIG. 1. The signal on connection 132 is the reference voltage automatic power control signal, $V_{APC}$, that determines the transmit power level and provides the power profile. The $V_{APC}$ signal on connection 132 is supplied to a reconstruction filter, which includes resistor 240 and capacitor 242. In this manner, a reference voltage for the transmit power level and power profile is supplied via connection 234 to the control input of the variable gain element 232.

The output of variable gain element 232 on connection 246 is at an intermediate frequency having both an AM component and a PM component and is called the "power measurement signal." This power measurement signal is related to the absolute output power of power amplifier 160, and includes a very small error related to the AM and PM components present in the signal. The output of variable gain element 232 on connection 246 is supplied to the input of a power detector 262 and is also supplied to a limiter 248 in the phase locked loop 220, although the limiter 248 may reside outside of the phase locked loop 220.

The IF signal on connection 246 includes both an AM component and a PM component. The IF signal on connection 246 is supplied to the power detector 262, which provides, on connection 264, a baseband signal representing the instantaneous level of IF power present on connection 246. The output of power detector 262 on connection 264 is supplied to the inverting input of amplifier 268.

The amplifier 268, capacitor 266 and capacitor 270 form a comparator 284, which provides the error signal used to control the power amplifier 160 via connection 272. The non-inverting input to the amplifier 268 is supplied via connection 138 from the output of the modulator 146. The signal supplied on connection 138 comprises an IF signal containing the amplitude modulation (AM) portion of the modulated signal. The signal on connection 138 supplied to the non-inverting input of amplifier 268 contains the demodulated amplitude information of the AM signal developed by the modulator 146.

The gain of the power control loop 145 amplifies the signal on connection 272 such that the difference between the signals on connections 264 and 138 input to amplifier 268 provide an error signal on connection 272 that is used to control the output of the power amplifier 160. The error signal on connection 272 is supplied to the variable gain element 274. The variable gain element 274 receives a control signal input from the non-inverting output of amplifier 236 via connection 234. The variable gain element 274 is similar in structure to the variable gain element 232. However, the variable gain element 274 has a gain function that is the inverse of the gain function of the variable gain element 232, since the control input to the variable gain element 232 is supplied from the inverting output of amplifier 236. In this manner, the power amplifier control signal on connection 172 supplied to the control port of power amplifier 160 drives the power amplifier 160 to provide the proper output on connection 162.

The level of the signal on connection 264 and the level of the signal on connection 138 will be nearly equal, by the function of the negative feedback loop in the power control element 145. For example, if the output level of the variable gain element 232 is increased by a factor of 10, then the level of the output of power amplifier 160 will decrease accordingly to maintain equilibrium at the input of the amplifier 268. The output of the power amplifier 160 changes to cancel the gain change of variable gain element 232. In this manner, the feedback amplitude signal on connection 264 remains nearly equal to the reference amplitude signal on connection 138. In this manner, a feedback signal containing an AM and a PM portion is present on connection 246. The signal on connection 246 is converted by power detector 262 from an IF signal to a baseband signal on connection 264. The difference between the signal on connection 264 and the signal on connection 138 is amplified by amplifier 268 and amplifier 274 to drive the power amplifier control port on connection 172 so that the desired signal is achieved at the output of the power amplifier 160 on connection 162. The power control loop 145 has sufficient gain so that the error signal on connection 272 can be kept small. In such a case, the gain changes of the variable gain element 232 and the power amplifier 160 will substantially be the inverse of each other.

The amplifier 268 compares the power measurement signal on connection 264 with a reference voltage signal on connection 138, representing the AM portion of the signal supplied by the modulator 146. The output of amplifier 268 on connection 272 is the amplitude error signal. The DC voltage level on connection 138 affects the desired static output power for the amplifier 268, irrespective of AM modulation. The amplifier 268 compares the signal level on connection 264 with the signal level on connection 138 and then amplifies the difference, thus providing an error signal on connection 272. The comparator 284 functions as an integrator, which is also a low pass filter.

The power control signal on connection 172 is driven by the variable gain element 274, which corrects for the effect that variable gain element 232 has on the transfer function of the power control loop 145. The variable gains of variable gain element 232 and variable gain element 274 are complimentary. Because the feedback power measurement signal is present on connection 264 and the amplitude reference signal is present on connection 138, the amplifier 268 provides a dual function; (1) it amplifies the AM error signal (the difference between the signal on connection 138 and the signal on connection 264) so as to modulate the power output of power amplifier 160 via connection 172 to have the correct amount of AM; and (2) it performs the average power comparison and amplifies the result, thus providing a control signal also via connection 172 that drives the power amplifier 160 to the correct average power output. Therefore, at connection 172 both the AM error signal and the power control error signal are amplified to a level sufficient to drive the power amplifier 160 to the desired average power with the desired AM signal. In this manner, the desired AM portion of the signal is supplied to the control input 172 of power amplifier 160 and made present on the power amplifier output on connection 162. The mixer 226, variable gain element 232, power detector 262, amplifier 268 and variable gain element 274 provide a continuous closed-loop power control feedback system to control the power output of power amplifier 160, while allowing for the introduction of the AM portion of the transmit signal via connection 138.

The continuous power-control feedback loop allows the correction of any phase shift caused by power amplifier 160. In this manner, the PLL 220 includes a feedback loop for looping back the output of power amplifier 160 to the input of phase/frequency detector 208. Any unwanted phase shift generated by the power amplifier 160 will be corrected by the PLL 220. The output of variable gain element 232 passes any phase distortion present via connection 246 to limiter 248 for correction by the PLL 220. As such, the phase of the output of power amplifier 160 is forced to follow the phase of the LO signal on connection 156.

In order to remove the AM from the output of variable gain element 232, the variable gain element 232 is connected via connection 246 and connection 147 to the input of limiter 248. The limiter 248 develops a feedback signal containing only a PM component on connection 206. The baseband I and Q information signals are supplied via connections 278 and 282, respectively, to the modulator 146. The I and Q baseband information signal interface is understood by those having ordinary skill in the art. As a result of the operation of the modulator 146, the output on connection 252 is an intermediate frequency signal including an AM component providing an AM reference signal and a PM component providing a PM reference signal. An output of modulator 146 is supplied via connection 138 to the amplifier 268. In this manner, the signal provided on connection 138 is a reference signal that allows amplitude control of the power control loop 145 at power output levels over the fill output power range.

The modulator 146 also provides the PM component of the signal on connection 252. This PM signal is then supplied to limiter 249, which outputs a signal on connection 256 containing the phase reference component. The components within the phase locked loop 220 provide gain for the comparison of the PM on connection 256 and the phase feedback signal on connection 206, thus providing a phase error output of the phase detector 208 on connection 210. In this manner, a feedback signal taken from the output of variable gain element 232 on connection 246 is supplied as continuous feedback to the phase locked loop 220.

The error signal output of modulator 146 on connection 252 containing the phase error, will get smaller and smaller as the gain of the phase locked loop 220 increases. However, there will always be some error signal present, thus enabling the phase locked loop 220 to achieve phase lock. It should be noted that even when the power amplifier 160 is not operating, there will always be some small leakage through the power amplifier 160 onto connection 162. This small leakage is sufficient to provide a feedback signal through the variable gain element 232 and into the phase locked loop 220 such that the phase locked loop 220 can be locked using just the leakage output of power amplifier 160. In this manner, a single feedback loop can be used to continuously control the output power of power amplifier 160 from the time that the amplifier is off through the time when the amplifier 160 is providing full output power.

The modulator 146 receives an LO input signal from synthesizer 157 via connection 156. The LO signal is frequency divided by a number "x" in order to provide a signal having an appropriate frequency on connection 204. The number "x" is chosen so as to minimize the design complexity of the synthesizer 157 and can be, for example, but not limited to, chosen to convert the output of the synthesizer 157 to a frequency of about 100 MHz.

The output of phase/frequency detector 208 on connection 210 is a digital signal having a value of either a 0 or a 1 with a very small transition time between the two output states. This signal on connection 210 is supplied to low-pass filter 212, which integrates the signal on connection 210 and places a DC signal on connection 214 that controls the frequency of the transmit voltage control oscillator (TX VCO) 216.

The output of the TX VCO 216 is supplied via connection 158 to a low noise divider 300. The low noise divider 300 comprises low band circuitry, high band circuitry, and buffer circuitry, and will be described in detail below. The output of the low noise divider 300 is provided to the power amplifier 160.

The synthesizer 157, limiter 248, modulator 146, limiter 249, divider 202, phase/frequency detector 208, low-pass filter 212, TX VCO 216 and the low noise divider 300 form a phase locked loop (PLL) 220, which is used to determine the transmit frequency on connection 158. When the PLL 220 is settled, or "locked," then the two signals entering the phase/frequency detector 208 on connections 256 and 206 have precisely the same phase and frequency, and the output of the phase/frequency detector 208 on connection 210 goes to zero. The output of the integrating low-pass filter 212 on connection 214 stabilizes, resulting in a fixed frequency out of TX VCO 216. For example, the synthesizer 157 and the mixer 226 ensure that the frequency of the signal output from the TX VCO 216 on connection 158 tracks the sum of the frequencies of the local oscillator signal supplied by synthesizer 157 and the IF frequency on connection 206.

When the phase locked loop 220 is locked, the phase of the signal on connection 256 and the phase of the signal on connection 206 will be equal. The gain in the phase locked loop 220 has to be sufficiently high to amplify the error signal on connection 206 to a level at which the phase/frequency detector 208 can make a comparison. By using the modulator 146 to impose the I and Q information signals on the signal on connection 204, and because the phase locked loop 220 will keep the phase of the TX VCO 216 locked, the phase of the signal output from the TX VCO 216 on connection 158 will follow that of the phase imposed by the modulator 146. In this manner, the PM error signal present on connection 210 is minimized by the very high sensitivity, of the order of many MHz per volt, of the TX VCO 216.

Because the power control loop 145 is a closed loop for AM signals at connection 138, it is possible to use a non-linear, and therefore highly efficient, power amplifier 160. Furthermore, the undesirable and detrimental AM-to-PM conversion, which occurs due to the amplitude dependence of an amplifier's phase shift, is rectified by the power amplifier 160 being included within the phase locked loop 220. By separating the AM and the PM modulation and by providing closed loop control for both the AM and PM modulation, a non-linear, and therefore highly efficient power amplifier can be used.

In some applications it is desirable to allow the power amplifier 160 to output a signal containing both an AM component and a PM component, while maintaining the power amplifier 160 as a non-linear (and therefore highly efficient) power amplifier. In such a case, the output of modulator 146 will include both an AM and a PM component, with limiter 249 used to cancel the AM component present on connection 252, thereby preventing any AM-to-PM conversion in the phase/frequency detector 208.

Figure 3:
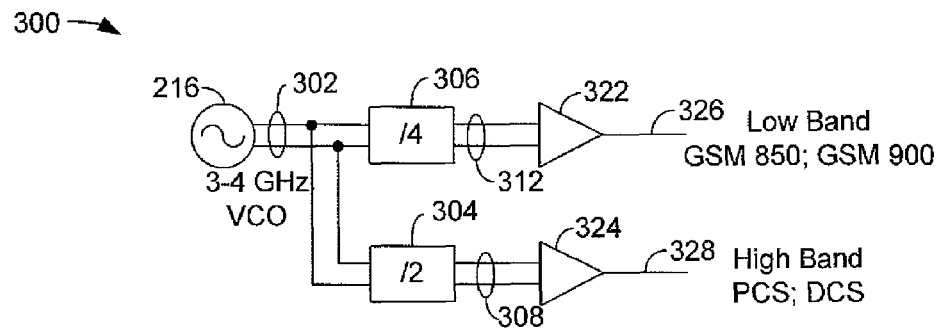
FIG. 3 is a block diagram illustrating an embodiment of a low noise divider of FIG. 2.

FIG. 3 is a block diagram illustrating an embodiment of a low noise divider 300 of FIG. 2. The low noise divider 300 receives a differential output of the TX VCO 216 on connection 302. As known in the art, the differential output on connection 302 includes positive and negative components of the signal and represents the in-phase and quadrature-phase components of the transmit signal. When implementing low band operation, the output of the TX VCO 216 is provided to the low band divider 306, which, in this example, divides the output of the TX VCO 216 by a factor of four (4) (divide-by-four). When implementing high band operation, the output of the TX VCO 216 is provided to the high band divider 304, which, in this example, divides the output of the TX VCO 216 by a factor of two (2) (divide-by-two). In this example, the output of the TX VCO 216 is approximately 3-4 GHz.

The differential output of the low band divider 306 is supplied to the buffer 322. While shown as a single buffer, the buffer 322 may comprise a number of different buffer stages. In this example, the output of the buffer 322 on connection 326 is the low band transmit signal that is provided to the power amplifier 160 (FIG. 2). The differential output of the high band divider 304 is supplied to the buffer 324. While shown as a single buffer, the buffer 324 may comprise a number of different buffer stages. In this example, the output of the buffer 324 on connection 328 is the high band transmit signal that is provided to the power amplifier 160 (FIG. 2).

Figure 4:
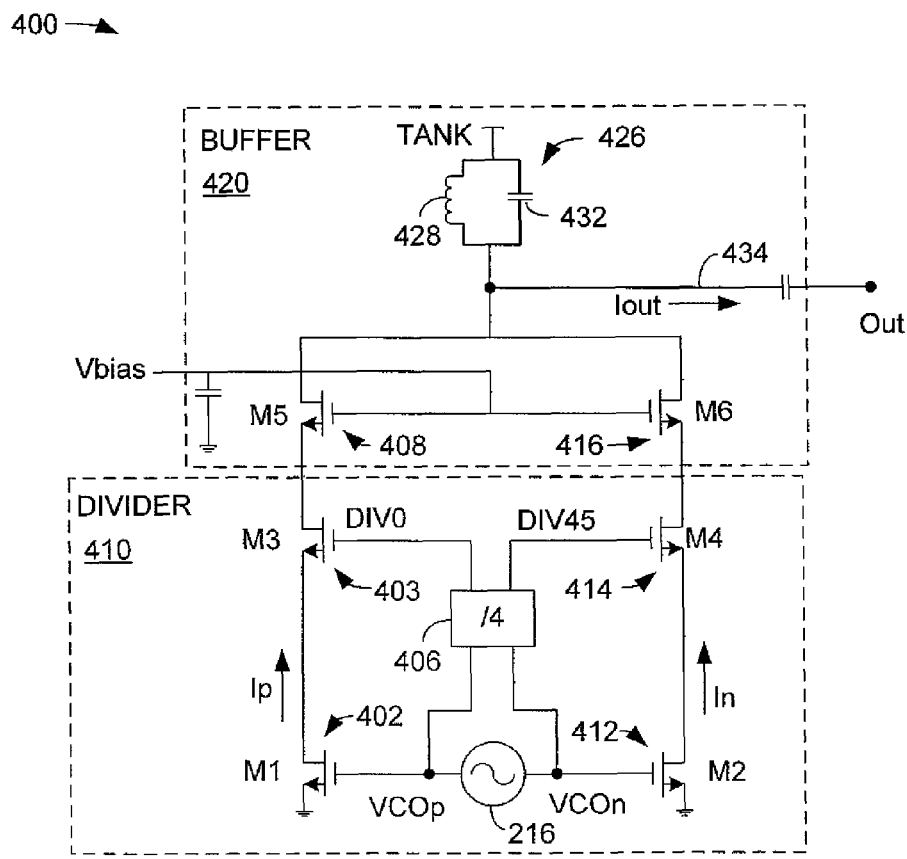
FIG. 4 is a simplified schematic and block diagram of a low noise divide-by-four buffer.

FIG. 4 is a simplified schematic and block diagram of a low noise divide-by-four buffer 400. The divide-by-four buffer 400 includes the TX VCO 216, transistors 402, 403, 408, 412, 414, 416, divider 406 and tank circuit 426. In this example, the positive differential output (VCOp) of the TX VCO 216 is provided to the transistor 402 and the negative TX VCO output (VCOn) is provided to the transistor 412. The output of the divider 406 are the divided-by-four 0 degree signal (DIV0) and the divided-by-four 45 degree signal (DIV45). The signals DIV0 and DIV45 are separated in phase by 45 degrees.

The divide-by-four buffer 400 includes two current paths. A first current path (Ip) is formed by the transistors 402, 403 and 408. A second current path (In) is formed by the transistors 412, 414 and 416.

The two current paths provide current (Ip and In) to the tank circuit 426. The tank circuit 426 is a tuned inductive (L)—capacitive (C) circuit including inductor 428 and capacitor 432.

The transistors 408 and 416 are controlled by a bias signal, Vbias, and provide a control as to when the currents Ip and In flow and when they shut off. The transistors 403 and 414 provide another control as to when the currents Ip and In flow and when they shut off.

Figure 5:
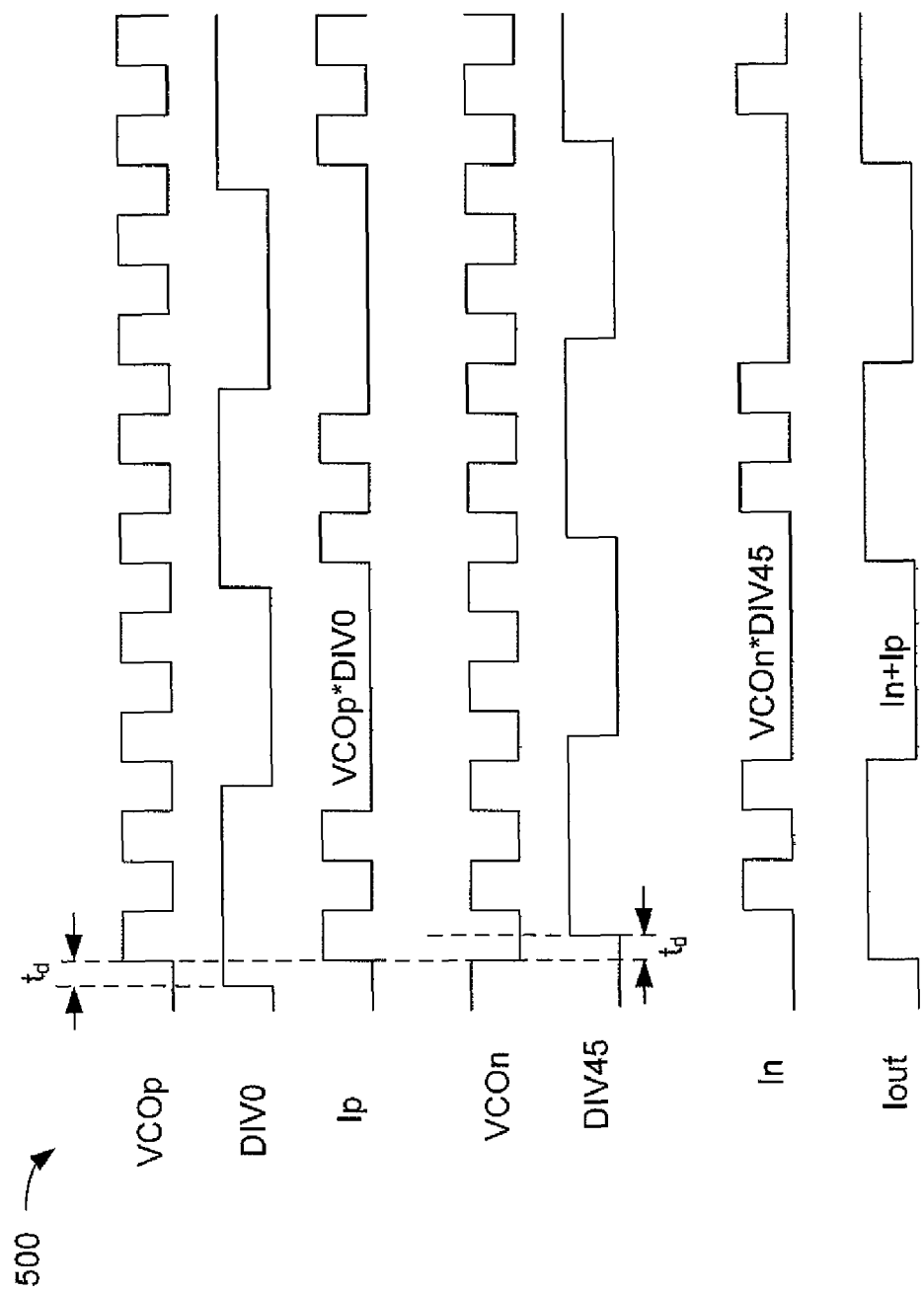
FIG. 5 is a timing diagram illustrating the timing of the signals shown in FIG. 4.

FIG. 5 is a timing diagram 500 illustrating the timing of the signals shown in FIG. 4. The signals DIV0 and DIV45 are the delayed versions of the divide-by-four output waveform with 45 degree phase difference between them. The edges of the signals DIV0 and DIV45 are delayed or advanced with respect to the output edges of the VCO (VCOp and VCOn) by an appropriately selected constant time, $t_d$, as shown in FIG. 5. Because the transistors 402, 403 and 412, 414 are cascaded in the low noise divide-by-four buffer 400 of FIG. 4, the current Ip flows in the branch only when both cascaded transistors 402 and 403 are on. Similarly, the current In flows in the branch only when both cascaded transistors 412 and 414 are on. The on-off state of the currents in the two branches are represented by Ip and In, in the timing diagram 500. As shown in FIG. 5, the current, Ip, can be generated by a Boolean AND operation between the signal VCOP and DIV0. Similarly, the current, In, can be generated by a Boolean AND operation between the signal VCOn and the signal DIV45. The total current that flows through the tuned tank circuit 426 is the sum of the current Ip and the current In, and is represented by the current Iout in FIGS. 4 and 5. The current Iout is periodic with a period of one fourth of the main VCO output tone, represented as VCOp and VCOn. The current Iout generates a sinusoidal voltage, which is the desired divided-by-four tone at the output 434.

As shown by the timing diagram 500, as long as the delay, $t_d$, is sufficiently large, any jitter on the edges of the signals Ip and In and hence, Iout, is determined only by the jitter in the signals VCOp and VCOn. In other words, by properly selecting the value of the delay, $t_d$, which should be large enough to account for process and temperature variations and mismatches in the circuit components, the phase noise at the output 434 will depend only on the original VCO phase noise and not on the immediate divider output. Thus, the components of the divide-by-four buffer 400 may be noisy without affecting the phase noise at the output. This allows the components of the divide-by-four buffer 400 to be designed to consume a low amount of current because their phase noise performance is not critical to the phase noise at the output of the low noise divider. As a result, unlike traditional dividers, the low noise new divide-by-four buffer 400 can be designed to be low power and hence, somewhat noisy without affecting the output tone's phase noise. This results in considerable power saving in the low noise divider.

Figure 6:
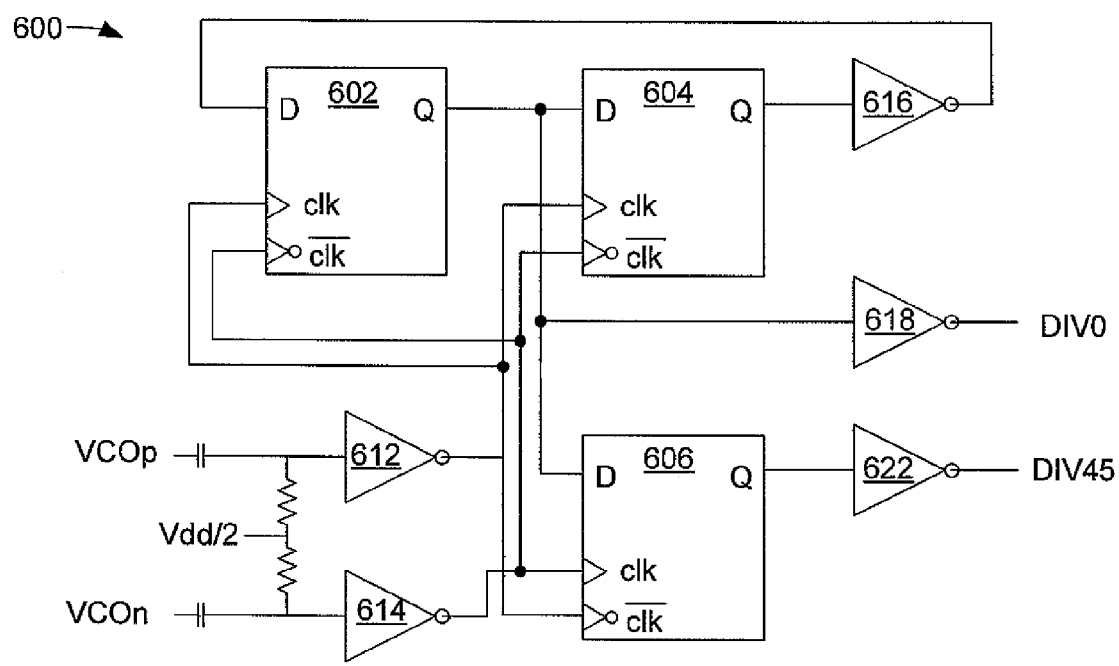
FIG. 6 is a simplified block diagram of a circuit for generating the delayed divide-by-four waveforms of FIGS. 4 and 5.

FIG. 6 is a simplified block diagram of a circuit for generating the delayed divide-by-four waveforms of FIGS. 4 and 5. The circuit 600 comprises D flip flops 602, 604 and 606; and inventers 612, 614, 616, 618 and 622. The D flip flops 602, 604 and 606 can be designed with minimal noise constraints because, as mentioned above, the phase noise of the low noise divider is influenced only by the phase noise of the VCO output. In this example, the delays of the D flip flops 602, 604 and 606 and the delays of the inverters 612, 614, 616, 618 and 622 are sufficient to achieve an appropriate time delay, $t_d$, between VCOp and DIV0 and between VCOn and DIV45, as shown in FIG. 5.

The circuitry used to divide the frequency of the VCO by four and to generate the desired time delay can be implemented using a few low power D flip flops and inverters. As long as the time delay, td, is sufficiently large, the flip flops can be designed to be relatively low power and noisy. However, the transition time of the flip flops should be sufficiently fast for the divide-by-four buffer 400 to operate at the VCO operating frequency, which is approximately 3-4 GHz in this example. The VCO operating frequency determines the limit on the minimum current consumption in the flip flops and inverters.

Figure 7:
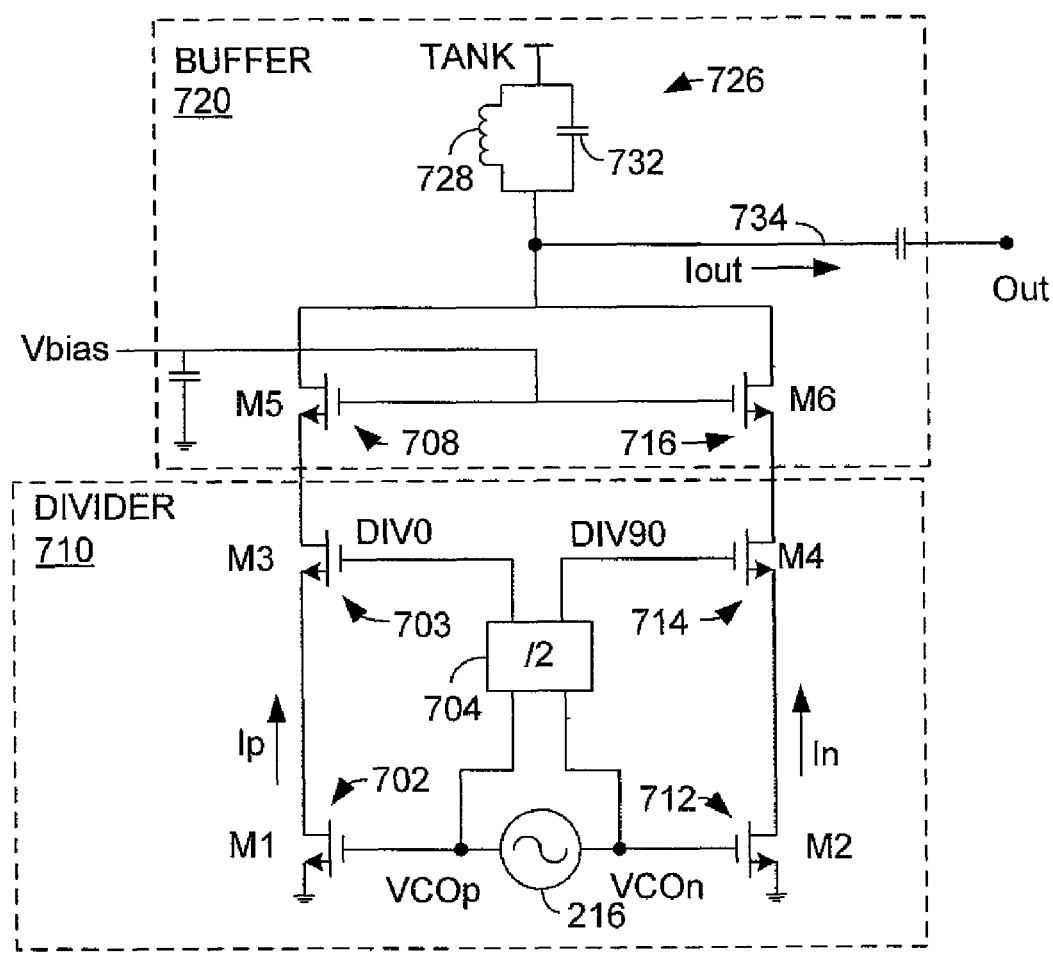
FIG. 7 is a simplified schematic and block diagram of a low noise divide-by-two buffer.

FIG. 7 is a simplified schematic and block diagram of a low noise divide-by-two buffer 700. The divide-by-two buffer 700 includes the TX VCO 216, transistors 702, 703, 708, 712, 714, 716, divider 704 and tank circuit 726. In this example, the positive differential output (VCOp) of the TX VCO 216 is provided to the transistor 702 and the negative TX VCO output (VCOn) is provided to the transistor 712. The output of the divider 704 are the divided-by-two 0 degree signal (DIV0) and the divided-by-two 90 degree signal (DIV90). The signals DIV0 and DIV90 are separated in phase by 90 degrees.

The divide-by-two buffer 700 includes two current paths. A first current path (Ip) is formed by the transistors 702, 703 and 708. A second current path (In) is formed by the transistors 712, 714 and 716.

The two current paths provide current (Ip and In) to the tank circuit 726. The tank circuit 726 is a tuned inductive (L)—capacitive (C) circuit including inductor 728 and capacitor 732.

The transistors 708 and 716 are controlled by a bias signal, Vbias, and provide a control as to when the currents Ip and In flow and when they shut off. Transistors 703 and 714 provide another control as to when the currents Ip and In flow and when they shut off.

Figure 8:
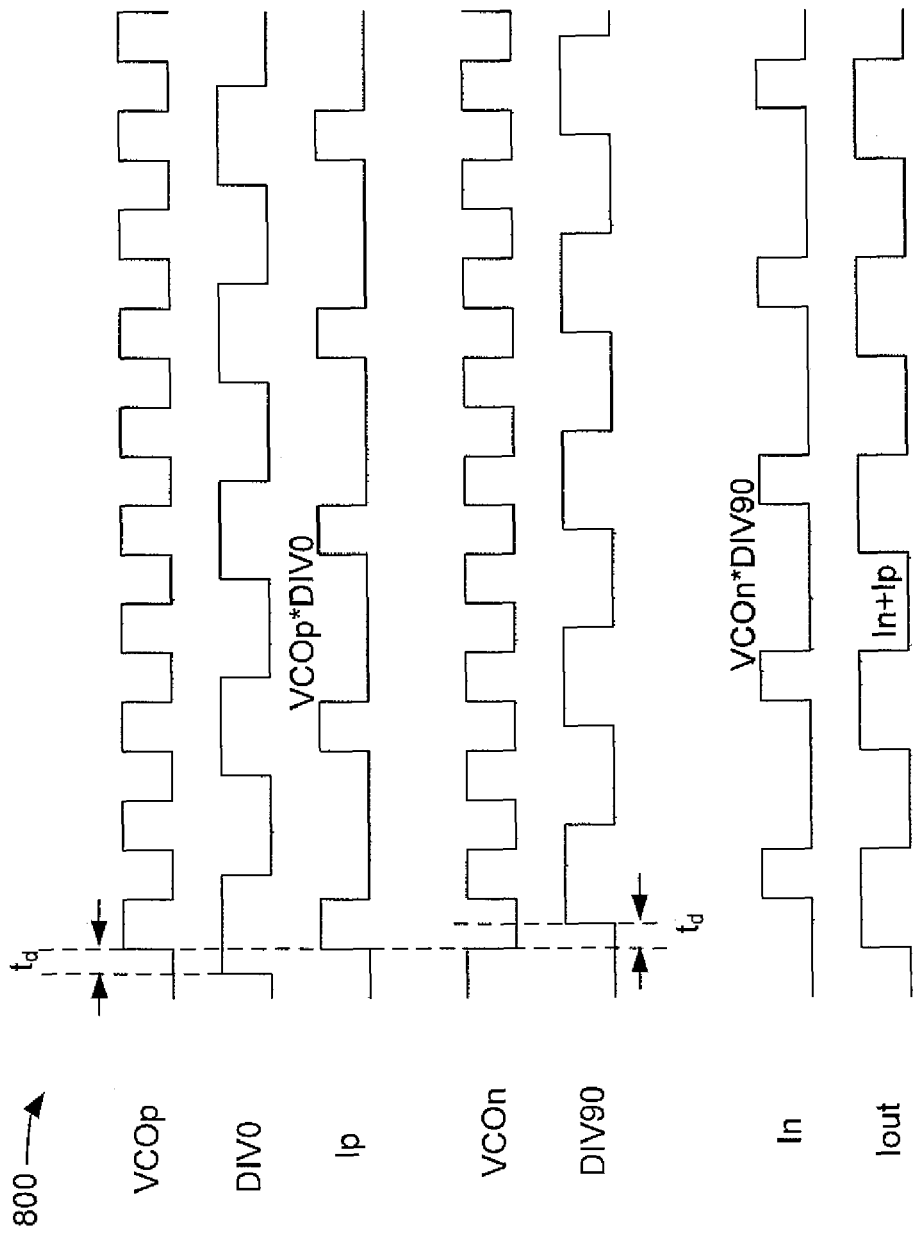
FIG. 8 is a timing diagram illustrating the timing of the signals shown in FIG. 7.

FIG. 8 is a timing diagram 800 illustrating the timing of the signals shown in FIG. 7. The signals DIV0 and DIV90 are the delayed versions of the divide-by-two output waveform with 90 degree phase difference between them. The edges of the signals DIV0 and DIV90 are delayed or advanced with respect to the output edges of the VCO (VCOp and VCOn) by an appropriately selected constant time, $t_d$, as shown in FIG. 8. Because the transistors 702, 703 and 712, 714 are cascaded in the low noise divide-by-two buffer 700 of FIG. 7, the current Ip flows in the branch only when both cascaded transistors 702 and 703 are on. Similarly, the current In flows in the branch only when both cascaded transistors 712 and 714 are on. The on-off state of the currents in the two branches are represented by Ip and In, in the timing diagram 800. As shown in FIG. 8, the current, Ip, can be generated by a Boolean AND operation between the signal VCOP and DIV0. Similarly, the current, In, can be generated by a Boolean AND operation between the signal VCOn and the signal DIV90. The total current that flows through the tuned tank circuit 726 is the sum of the current Ip and the current In, and is represented by the current Iout in FIGS. 7 and 8. The current Iout is periodic with a period of one half of the main VCO output tone, represented as VCOp and VCOn. The current Iout generates a sinusoidal voltage, which is the desired divided-by-two tone at the output 734.

An important observation from the timing diagram 800 is that as long as the delay, $t_d$, is sufficiently large, the jitter on the edges of the signals Ip and In and hence Iout, is determined only by the jitter in the signals VCOp and VCOn. In other words, by properly selecting the value of the delay, $t_d$, which should be large enough to account for process and temperature variations and mismatches in the circuit components, the phase noise at the output 734 will depend only on the original VCO phase noise and not on the immediate divider output. Thus, the components of the divide-by-two buffer 700 may be noisy without affecting the phase noise at the output. This allows the components of the divide-by-two buffer 700 to be designed to consume a low amount of current because their phase noise performance is not critical to the phase noise at the output of the low noise divider. As a result, unlike traditional dividers, the low noise new divide-by-two buffer 700 can be designed to be low power and hence, somewhat noisy without affecting the output tone's phase noise. This results in considerable power saving in the low noise divider.

Figure 9:
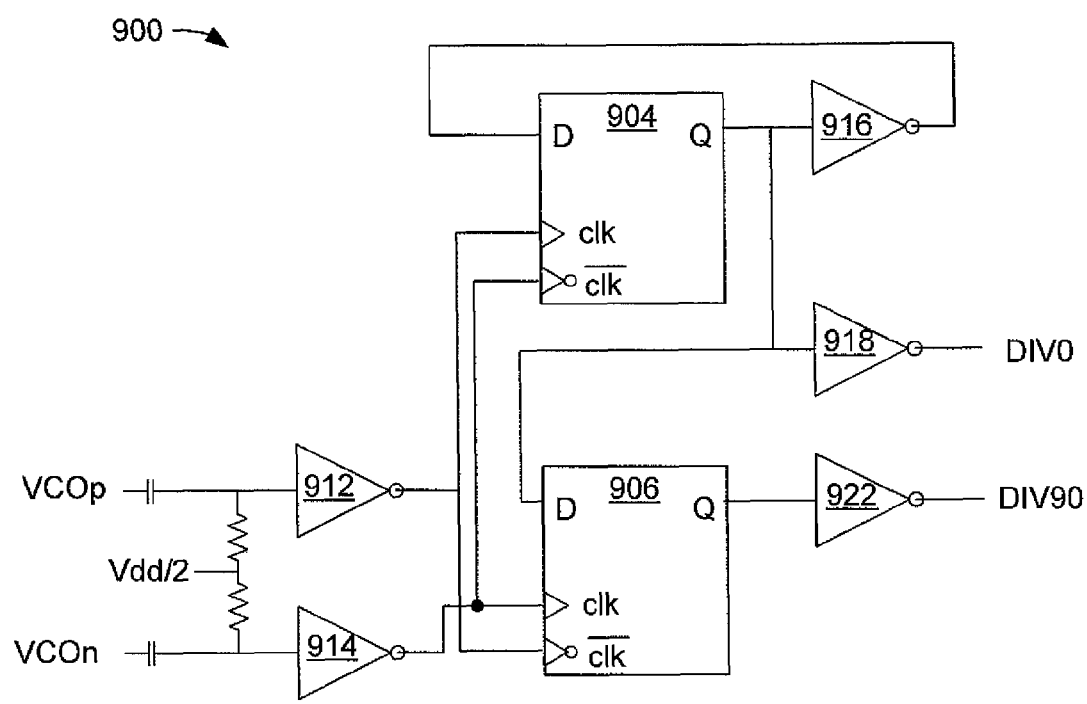
FIG. 9 is a simplified block diagram of a circuit for generating the delayed divide-by-two waveforms of FIGS. 7 and 8.

FIG. 9 is a simplified block diagram of a circuit for generating the delayed divide-by-two waveforms of FIGS. 7 and 8. The circuit 900 comprises D flip flops 904 and 906; and inventers 912, 914, 916, 918 and 922. The D flip flops 904 and 906 can be designed with minimal noise constraints because, as mentioned above, the phase noise of the low noise divider is influenced only by the phase noise of the VCO output. In this example, the delays of the D flip flops 904 and 906 and the delays of the inverters 912, 914, 916, 918 and 922 are sufficient to achieve an appropriate time delay, $t_d$, between VCOp and DIV0 and between VCOn and DIV90, as shown in FIG. 8.

The circuitry used to divide the frequency of the VCO by two and to generate the desired time delay can be implemented using a few low power D flip flops and inverters. As long as the time delay, $t_d$, is sufficiently large, the flip flops can be designed to be relatively low power and noisy. However, the transition time of the flip flops should be sufficiently fast for the divide-by-two buffer 700 to operate at the VCO operating frequency, which is approximately 3-4 GHz in this example. The VCO operating frequency determines the limit on the minimum current consumption in the flip flops and inverters.

Figure 10:
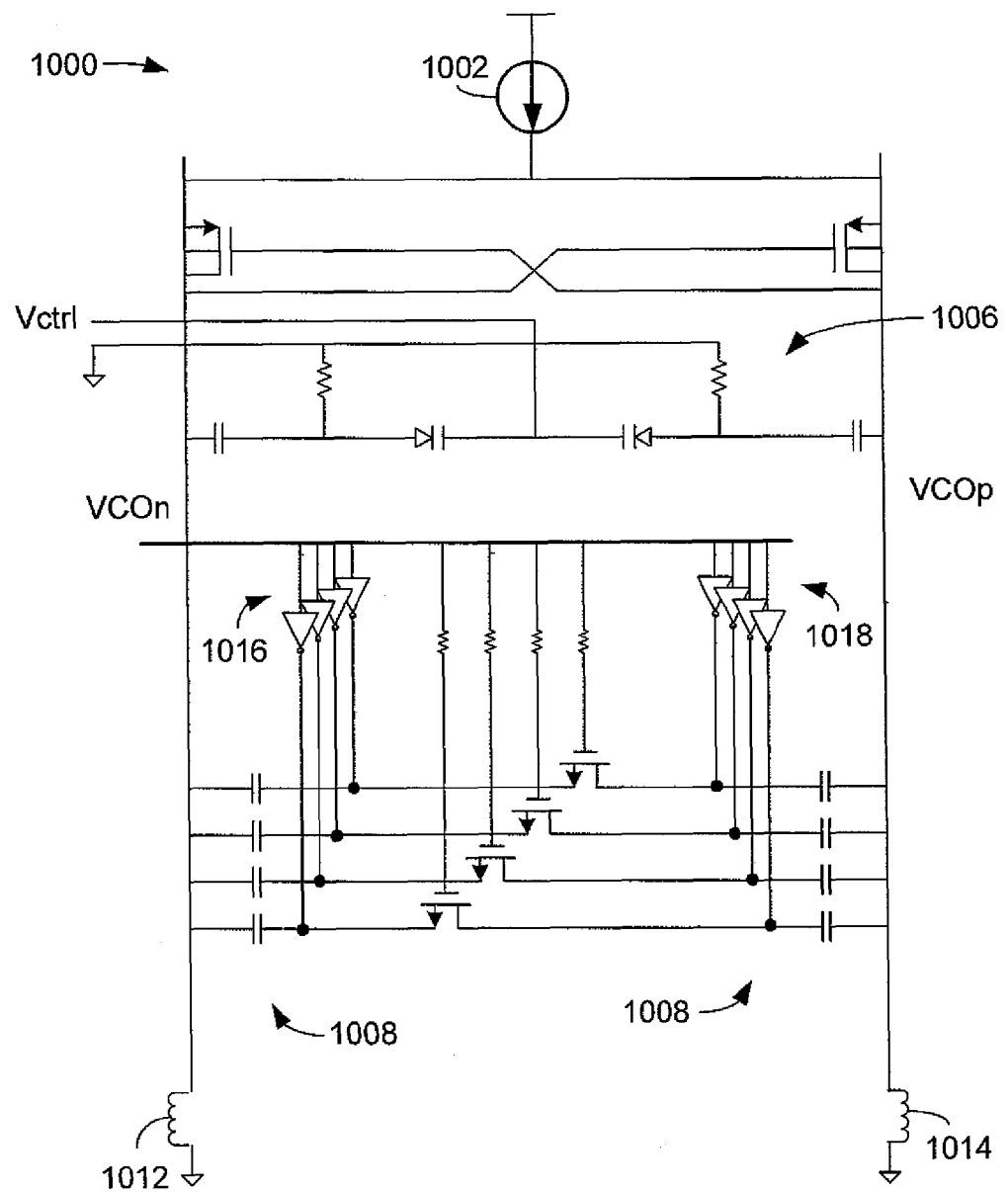
FIG. 10 is a simplified schematic diagram of a VCO.

FIG. 10 is a simplified schematic diagram of a VCO. The VCO 1000 includes a current source 1002, a fine tuning varactor cell 1006 and a coarse tuning (7-bit in this example) capacitor array 1008. The seven bit coarse tuning capacitor array 1008 is implemented to reduce the required $K_{VCO}$ to cover the entire frequency range. The fine tuning varactor cell 1006 is divided to four segments to linearize the gain of the VCO. On chip inductors 1012 and 1014 of 480 pH with a quality factor (Q) of 12.1 at 3.5 GHz are implemented. In this example, the supply voltage to the VCO 1000 and the buffers 1016 and 1018 is 2.7V. However, the supply voltage to the digital blocks such as the dividers, flip flops and gates can be set by a controllable low drop-out (LDO) regulator to be 1.25V to 1.58V. This can reduce the power consumption in the dividers and enable the use of the smallest feature length in the transistors of the digital blocks. For a 3.5 GHz VCO (for which the period of oscillation is about 285 pS), the delay, td, shown in FIG. 5 and FIG. 8 is 75 picoseconds (ps). This delay can be easily achieved with the gates and flip flops as described above.

In order to generate both high band and low band signals from the VCO using the low noise divider described above, the VCO drives not only separate dividers (which include a few flip flops) but also directly drives the buffer input transistors, as shown in FIGS. 4 and 7. Therefore the low noise divider requires the VCO to drive relatively high constant parasitic capacitors, which could potentially reduce the frequency coverage range of the VCO if the inductance of the tank circuit is not appropriately adjusted. Therefore, careful minimization of the parasitic capacitors imposed on the VCO outputs is desirable.

Figure 11:
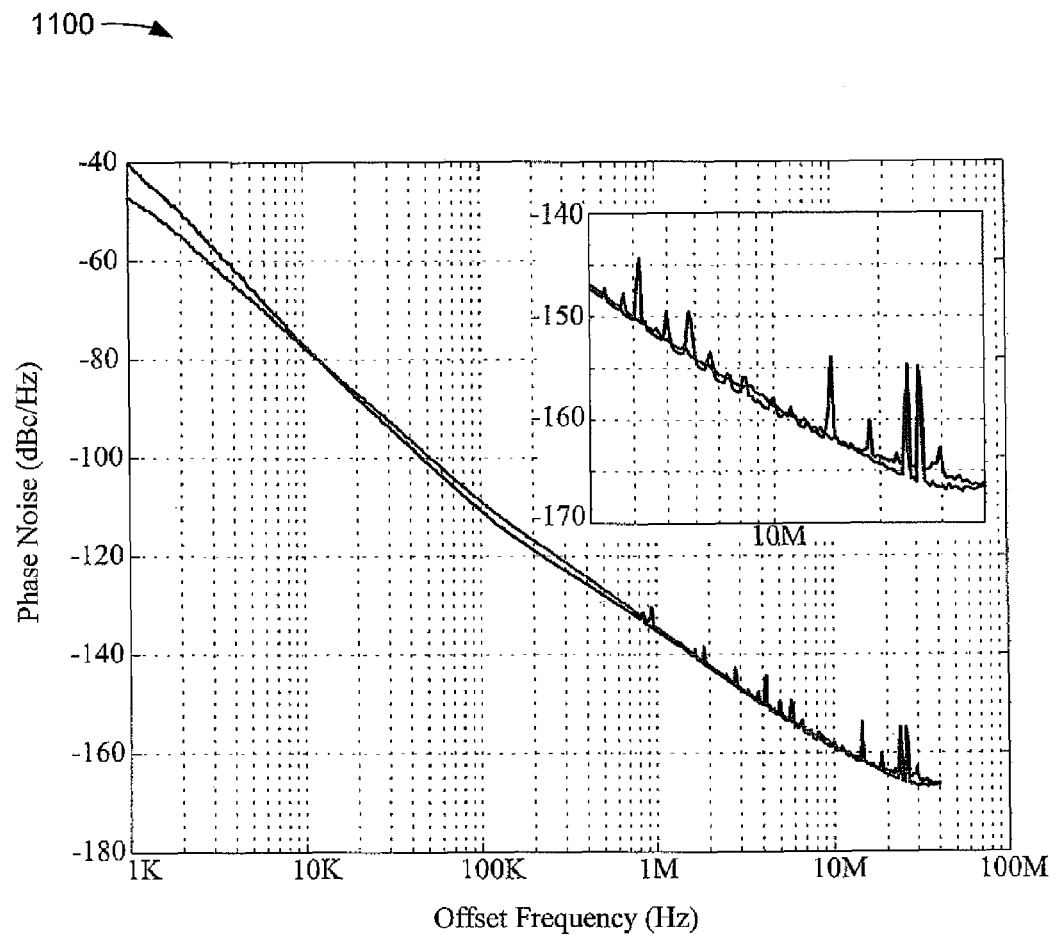
FIG. 11 is a diagram illustrating the measured phase noise plots of a traditional VCO with divider and buffer and the low noise divider implemented in a divide-by-four configuration.

FIG. 11 is a diagram 1100 illustrating the measured phase noise plots of a traditional VCO with divider and buffer and the low noise divider implemented in a divide-by-four configuration. The diagram 1100 compares the performance of the low band signal in which the main VCO frequency has been divided by four. The center frequency for this example measurement is 888 MHz (set in the middle of the required range).

The diagram 1100 shows that the phase noise of the VCO and divider/buffer chain at 20 MHz away from the low band carrier of 888 MHz is about −164.4 dBc/Hz for the low noise divider versus about −163.7 dBc/Hz for the traditional divider and buffer. The overall phase noise plots are within 2 dB of each other down to offset frequencies of 10 KHz. While the traditional divider and buffer draws approximately 8.3 mA from a 2.7V supply in the dividers (6 mA in the first divider and 2.3 mA in the second), the low noise divider and buffer only consumes approximately 2.5 mA. The output buffers consume approximately 9.3 mA in the traditional design and approximately 9.4 mA in the low noise design respectively. The measured performance results are listed below in Table. 1. This illustrates that the low noise divider can achieve approximately the same phase noise as the traditional design but consume only 2.5 mA of current versus 8.3 mA of current.

TABLE 1

Table.1: Summary of the performance metrics for the traditional and new designs.

| | | /4 or /2 current (mA) | Buffer current (mA) | Phase noise at 20 MHz from carrier (dBc/Hz) | Required maximum phase noise at 20 MHz |
|---|---|---|---|---|---|
| New Design | Low Band | 2.5 | 9.3 | −164.4 | −162.0 |
| | High Band | 1.7 | 9.5 | −159.0 | −156.0 |
| Traditional Design | Low Band | 8.3 | 9.3 | −163.7 | −162.0 |
| | High Band | 6.0 | 11.7 | −158.3 | −156.0 |

Figure 12:
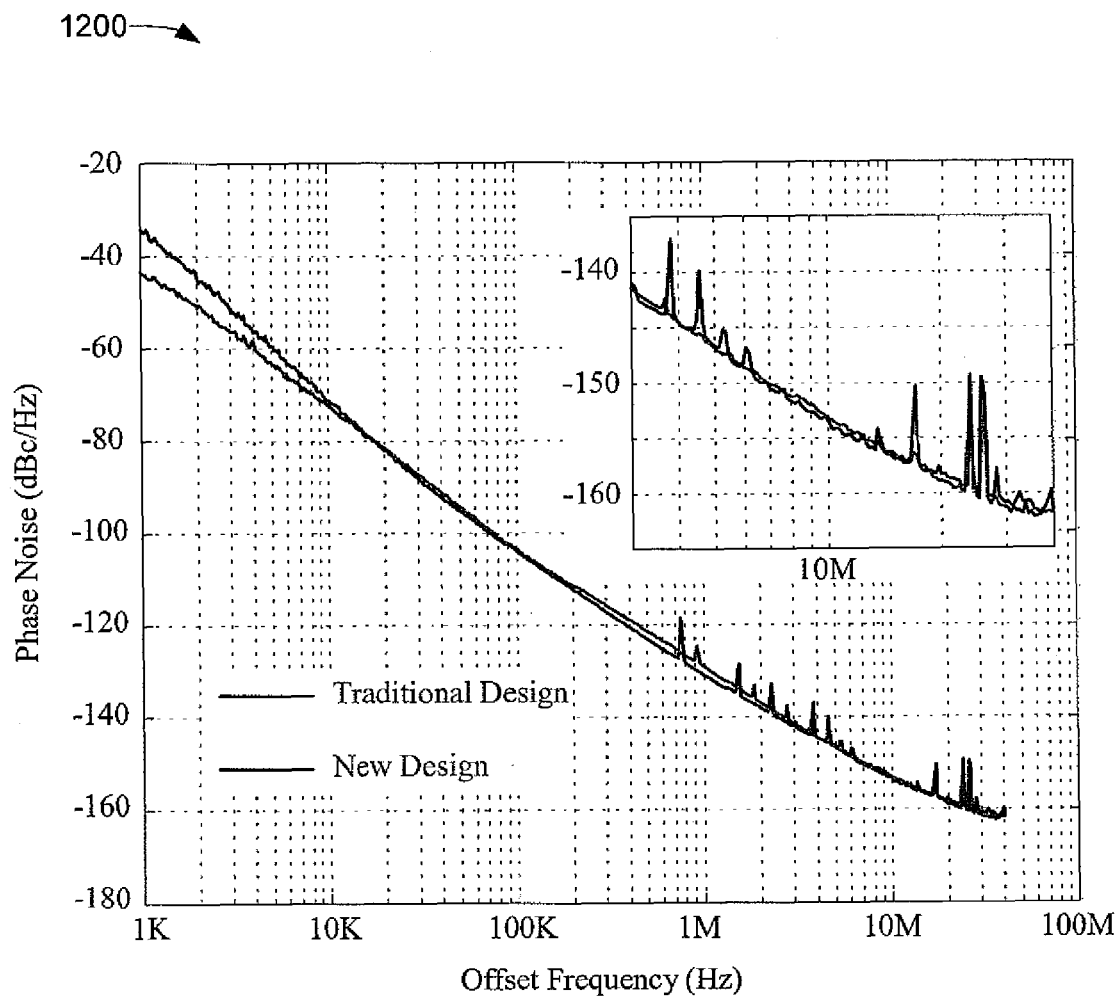
FIG. 12 is a diagram 1200 illustrating the measured phase noise plots of a traditional VCO with divider and buffer and the low noise divider implemented in a divide-by-two configuration.

FIG. 12 is a diagram 1200 illustrating the measured phase noise plots of a traditional VCO with divider and buffer and the low noise divider implemented in a divide-by-two configuration. FIG. 12 shows a comparison of the phase noise performance of the high band signal for which the VCO frequency is divided by two. In this example, the high band signal has a frequency of 1777 MHz (middle of the range). The phase noise at 20 MHz away from the carrier is −159.0 dBc/Hz for the low noise divider and is −158.3 dBc/Hz for a traditional design. Similar to the low band measured comparison diagram 1100, the phase noise plots are close to each other within 2 dB down to offset frequencies as low as 10 KHz. While the traditional divide-by-two consumes approximately 6 mA from a 2.7V supply, the low noise divider draws only approximately 1.7 mA. The buffer in the traditional design consumes approximately 11.7 mA versus approximately 9.5 mA in the low noise divider. Table. 1 summarizes the performance comparisons both for high band and low band generated tones.

Figure 13:
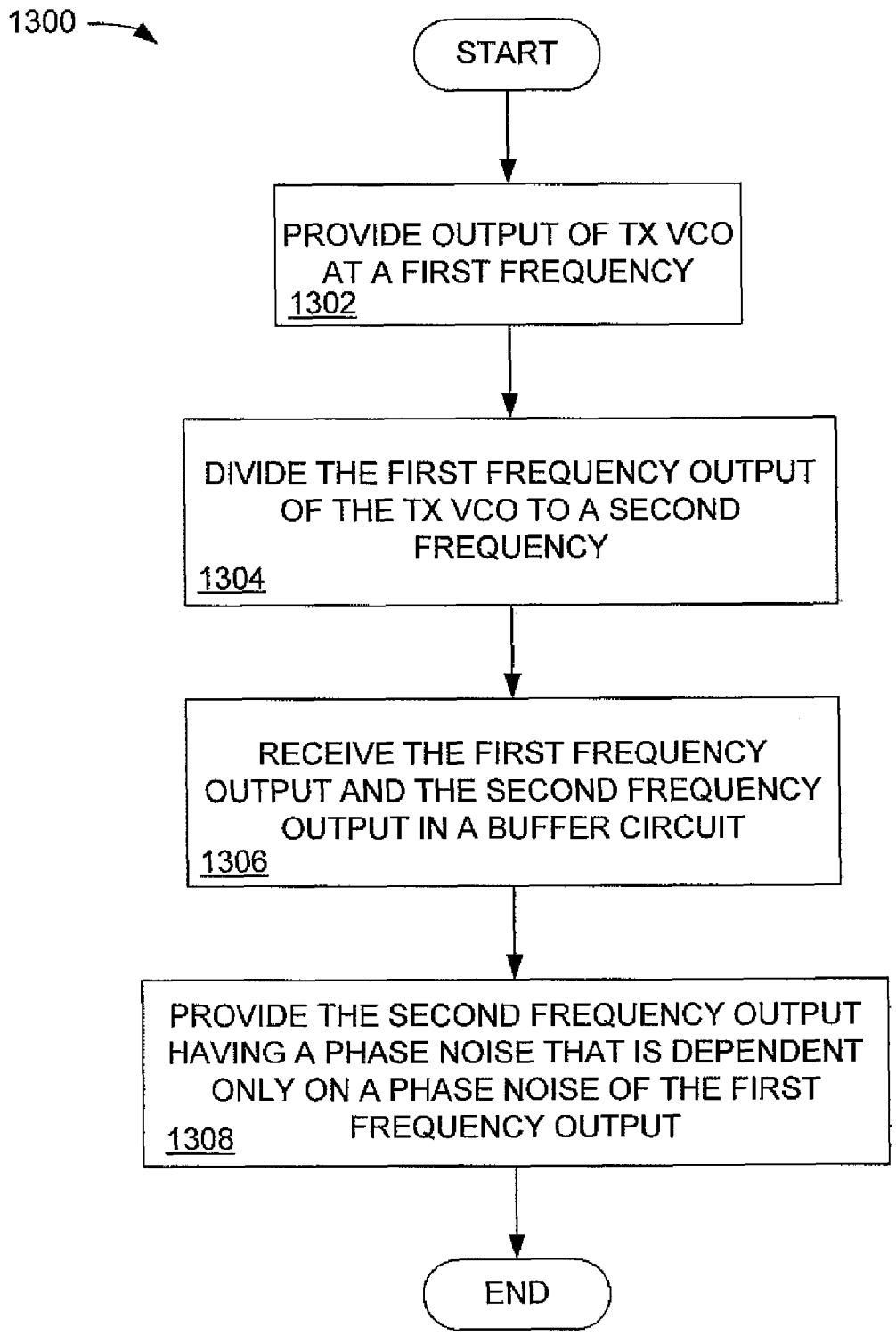
FIG. 13 is a flow chart describing the operation of an embodiment of a low noise divider.

FIG. 13 is a flow chart 1300 describing the operation of an embodiment of a low noise divider. The blocks in the flow chart need not be performed in the order shown. In block 1302, a first signal at a first frequency is provided by the TX VCO 216. In block 1304, the first signal is divided to a second signal having a second frequency. In block 1306, the first signal and the second signal are received by a buffer circuit. In block 1308, the second signal is provided as an output of the buffer circuit in which a phase noise of the second signal is dependent only on a phase noise of the output of the TX CVO 216.

While various embodiments of the invention have been described, it will be apparent to those of ordinary skill in the art that many more embodiments and implementations are possible that are within the scope of this invention. Accordingly, the invention is not to be restricted except in light of the attached claims and their equivalents.

What is claimed is:

1. An apparatus comprising:
   a voltage controlled oscillator (VCO) configured to provide a first output at a first frequency;
   a frequency divider configured to receive the first output and configured to provide a second output at a second frequency; and
   a circuit responsive to the first output and the second output and configured to provide a third output having a frequency equal to the second frequency such that phase noise in the third output depends on phase noise in the first output and does not depend on phase noise in the second output.

2. The apparatus of claim 1 further comprising a resonant buffer responsive to the third output, the resonant buffer providing a substantially sinusoidal output having a frequency equal to the second frequency.

3. The apparatus of claim 1 wherein the first output includes a pair of complementary signals, the second output includes a first divided signal and a second divided signal substantially the same as but phase shifted from the first divided signal, and the third output includes a first composite signal and a second composite signal, the first composite signal including a logical combination of the first divided signal and a first one of the complementary signals, the second composite signal including a logical combination of the second divided signal and a second one of the complementary signals.

4. The apparatus of claim 1 wherein the third output includes first and second composite signals formed by a logical combination of the first output and the second output, the second composite signal being substantially the same as but phase shifted from the first composite signal.

5. The apparatus of claim 4 further comprising a buffer for summing the first composite signal and the second composite signal to form an output having a frequency equal to the second frequency.

6. The apparatus of claim 5 in which the buffer includes a tuned inductive (L)—capacitive (C) circuit and directly receives the first composite signal and the second composite signal.

7. A method for dividing a signal, comprising:
providing a first output at a first frequency;
dividing the first output to provide a second output at a second frequency;
receiving the first output and the second output in a circuit configured to provide a third output having a frequency equal to the second frequency such that phase noise in the third output depends on phase noise in the first output and does not depend on phase noise in the second output.

8. The method of claim 7 further comprising providing a substantially sinusoidal output having a frequency equal to the second frequency.

9. The method of claim 7 wherein the first output includes a pair of complementary signals, the second output includes a first divided signal and a second divided signal substantially the same as but phase shifted from the first divided signal, and the third output includes a first composite signal and a second composite signal, the first composite signal including a logical combination of the first divided signal and a first one of the complementary signals, the second composite signal including a logical combination of the second divided signal and a second one of the complementary signals.

10. The method of claim 7 wherein the third output includes first and second composite signals formed by a logical combination of the first output and the second output, the second composite signal being substantially the same as but phase shifted from the first composite signal.

11. The method of claim 10 further comprising a buffer for summing the first composite signal and the second composite signal to form an output having a frequency equal to the second frequency.

12. The method of claim 11 in which the buffer includes a tuned inductive (L)—capacitive (C) circuit and directly receives the first composite signal and the second composite signal.

13. A portable transceiver comprising:
a transceiver;
a voltage controlled oscillator (VCO) configured to provide a first output at a first frequency;
a frequency divider configured to receive the first output and configured to provide a second output at a second frequency; and
a circuit responsive to the first output and the second output and configured to provide a third output having a frequency equal to the second frequency such that phase noise in the third output depends on phase noise in the first output and does not depend on phase noise in the second output.

14. The portable transceiver of claim 13 further comprising a resonant buffer responsive to the third output, the resonant buffer providing a substantially sinusoidal output having a frequency equal to the second frequency.

15. The portable transceiver of claim 13 wherein the first output includes a pair of complementary signals, the second output includes a first divided signal and a second divided signal substantially the same as but phase shifted from the first divided signal, and the third output includes a first composite signal and a second composite signal, the first composite signal including a logical combination of the first divided signal and a first one of the complementary signals, the second composite signal including a logical combination of the second divided signal and a second one of the complementary signals.

16. The portable transceiver of claim 13 wherein the third output includes first and second composite signals formed by a logical combination of the first output and the second output, the second composite signal being substantially the same as but phase shifted from the first composite signal.

17. The portable transceiver of claim 16 further comprising a buffer for summing the first composite signal and the second composite signal to form an output having a frequency equal to the second frequency.

18. The portable transceiver of claim 17 in which the buffer circuit includes a tuned inductive (L)—capacitive (C) circuit and directly receives the first composite signal and the second composite signal.

* * * * *